(12) United States Patent
Pakravan et al.

(10) Patent No.: US 6,259,391 B1
(45) Date of Patent: Jul. 10, 2001

(54) ANALOG GAIN CONTROL ADJUSTMENT USING A PROBABILISTIC ALGORITHM

(75) Inventors: Mohammed Reza Pakravan; Gwendolyn Kate Harris, both of Ottawa (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/335,836

(22) Filed: Jun. 18, 1999

(51) Int. Cl.[7] .................................................. H03M 1/62
(52) U.S. Cl. ...................... 341/139; 455/234.1; 455/232.1
(58) Field of Search .......................... 341/139; 455/234.1, 455/232.1, 234.2

(56) References Cited

U.S. PATENT DOCUMENTS

| | | | |
|---|---|---|---|
| 5,867,528 | 2/1999 | Verbueken | 375/222 |
| 5,892,472 * | 4/1999 | Shu et al. | 341/139 |
| 5,946,607 * | 8/1999 | Shiino et al. | 455/234.1 |
| 6,038,435 * | 3/2000 | Zhang | 455/234.1 |

* cited by examiner

*Primary Examiner*—Michael Tokar
*Assistant Examiner*—Anh Tran
(74) *Attorney, Agent, or Firm*—Max R. Wood; Swabey Ogilvy Renault

(57) ABSTRACT

A method and apparatus for adjusting the amplitude of a received discrete multi-tone analog signal contaminated by radio frequency interference from radio stations in the AM band are described. The amplitude is adjusted by controlling an analog gain controller in order to utilize substantially all of a dynamic input range of an analog-to-digital converter to reduce the quantization noise of the output digital signal. Data discrimination is truly improved and the capacity of usable discrete multi-tone channels is increased.

20 Claims, 4 Drawing Sheets

ANALOG GAIN CONTROL ADJUSTMENT USING A PROBABILISTIC ALGORITHM

TECHNICAL FIELD

The present invention relates to data delivery on telecommunication links and, in particular, to an improved apparatus and method for adjusting an amplitude of a received analog discrete multi-tone signal by contaminated radio frequency interference to utilize a full input dynamic range of an analog-to-digital converter, thereby minimizing quantization noise of the digital signal.

BACKGROUND OF THE INVENTION

An emerging trend in the telecommunications industry is to provide data services deployed over existing telephone twisted pair copper wires utilizing a frequency spectrum above the voice frequency band. One such type of transceiver enabled to provide data services deployed over existing telephone wires is one employing Discrete Multi-Tone (DMT) techniques. The DMT encoding makes use of a wide bandwidth channel divided up into sub-channels and data is modulated onto the sub-channels using a modulation method called quadrature amplitude modulation. The frequency band of the DMT channel is dictated by physical properties of the twisted pair wires used in providing existing telephone services and the existing infrastructure of the Public Switched Telephone Network (PSTN). The DMT frequency band of downstream transmissions extends into the frequency range of amplitude modulated (AM) radio transmissions and is, therefore, susceptible to Radio Frequency Interference (RFI) from AM radio stations.

The telephone wiring acts as a receiving antenna and converts electromagnetic energy from AM radio transmissions into a common mode voltage in the wiring. When the telephone wiring and the receiver front-end of a data transceiver are perfectly balanced, this contaminating signal should not cause any problems because of a differential mode of signal detection employed by the receiver. However, when there are front-end or wiring imbalances, a common mode voltage is detected at the receiver. As a result, AM radio signals from nearby stations within the frequency range are added to the input DMT signal and contaminate it. AM radio stations can occupy frequencies ranging from 535 kHz up to 1605 kHz with 10 kHz channelization. The effect the high frequency stations have on the received signal at the DMT transceiver can be suppressed by employing analog filters in the front-end of transceivers for partial rate services, e.g. G.lite ADSC, which is well known in the art. In this way, radio frequency interference (RFI) from radio stations above about 650 kHz is suppressed leaving the AM carriers below 650 kHz as most damaging to the received DMT signal. Analog filters cannot be used to suppress the RFI from full-rate ADSC because the full-rate implementation utilizes about twice the bandwidth of the G.lite implementation.

In the G.lite implementation, a logical solution to the damaging effects of the remaining low frequency AM RFI signals is to employ sharper analog filters or filters with lower frequency ranges to provide a better suppression of the RFI. However, there is considerable cost associated with this solution, including an increase in complexity of the transceiver and a loss of useful sub-channels in the DMT bandwidth.

Digital filters are used to complement the filtering done by the analog filters and, these are employed in order to reduce the net effect of the RFI from low frequency AM radio transmissions after the contaminated DMT signal is digitized. In order for digital filtering to be effective, the received analog signal should be optimally digitized.

Another effect that AM RFI has on the front-end processing of the received DMT signal, is that the signal characteristics are no longer predetermined. This is due to the influence of geographical location on the mix of RFI frequencies and their relative power levels. The unpredictable nature of the characteristics of the received RFI contaminated DMT signal leads to an inability of prior art transceivers to optimally digitize the received signal resulting in a higher quantization error than necessary being introduced in the digitization process.

A logical solution to the inability to optimally digitize the received DMT signal is to employ analog-to-digital converters of a higher resolution. However, an analog-to-digital converter of a higher resolution adds cost and complexity to the DMT transceiver.

In order to deploy data services on existing telephone twisted pair wires, there exits a need for the development of new apparatus and methods for AM RFI suppression using digital filtering anid, in particular, for an apparatus and method of reducing quantization noise in the digitization process.

SUMMARY OF THE INVENTION

In accordance with the present invention, an apparatus for adjusting an amplitude of a received RFI contaminated analog DMT signal to utilize substantially all of an input dynamic range of an analog-to-digital converter is provided. The apparatus comprises a received signal monitor for extracting signal characteristics from a digitized copy of the received analog signal and an embedded processor module for calculating, according to a mathematical algorithm, an amplification factor to be applied by an analog gain controller to the received RFI contaminated analog DMT signal.

A method of adjusting an amplitude of a received RFI contaminated analog DMT signal is also provided. The method comprises the steps of determining a predetermined number of characteristics respecting an amplitude distribution of the analog signal by analyzing an output of an analog-to-digital converter (ADC) in a receiver circuit of the transceiver. The characteristics are used in a mathematical algorithm to determine a gain adjustment to be applied to the analog signal. The analog gain controller is then controlled to adjust the amplitude of the analog signal based on the gain adjustment in order to utilize a greater input range of an analog-to-digital converter. This reduces quantization noise in the digital signal output by the analog-to-digital converter.

The target attributes include a target threshold level corresponding to a target signal clipping ratio. Based on the target threshold level, the analog gain controller is set to amplify the received RFI contaminated analog DMT signal in order to utilize substantially all of an input dynamic range of the analog-to-digital converter, thereby reducing the quantization noise of the output digital signal. After an initialization phase, the transceiver continues to monitor the signal clipping ratio and readjusts the analog gain control as required to adapt the fluctuations in RFI.

BRIEF DESCRIPTION OF THE DRAWINGS

The invention will now be described by way of example only, and with reference to the accompanying drawings, in which.

DETAILED DESCRIPTION OF THE PREFERRED EMBODIMENT

The amplitude of a received analog DMT signal may theoretically be adjusted to utilize substantially all of a dynamic input range of an analog-to-digital converter in order to minimize quantization noise of the digital signal output by the analog-to-digital converter by measuring an average amplitude of the received DMT signal, deriving a peak amplitude of the received DMT signal and applying a factor to the amplitude of the received DMT signal in order to adjust the amplitude of the received DMT signal to the full dynamic input range of the analog-to-digital converter. This method appears practical due to the fact that a DMT signal exhibits deterministic characteristics.

Figure 1:
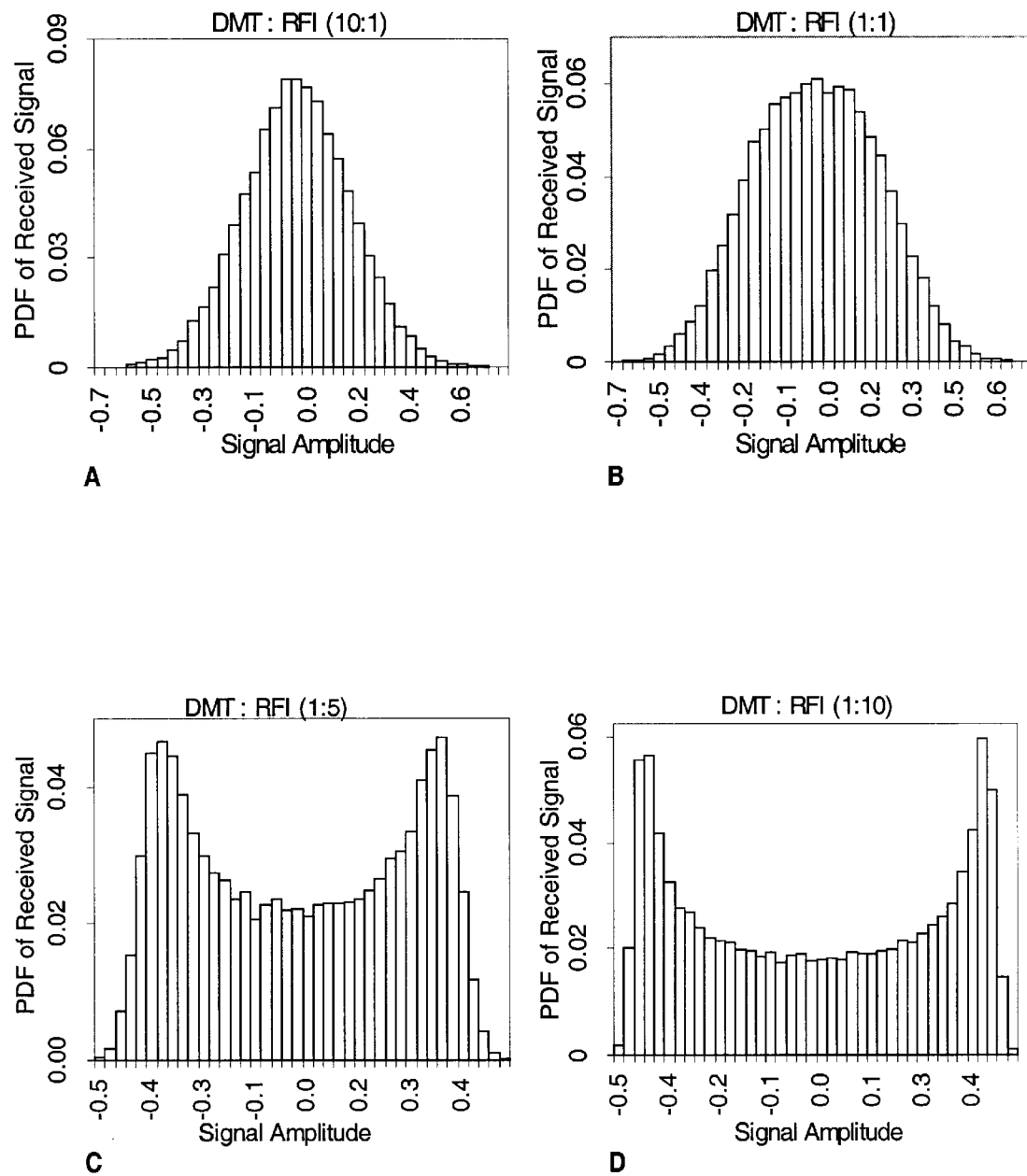
FIG. 1 is a sequence of graphs showing probability distribution functions of received DMT signals contaminated by RFI in a progression in which the amplitude of the DMT signal dominates the amplitude of the RFI to a signal in which the amplitude of the RFI dominates the amplitude of the received DMT signal.

Graph A of FIG. 1 shows a probability distribution function of a DMT signal. The probability distribution function indicates that a DMT signal has a high probability of having low amplitudes and a low probability of having high amplitudes, the distribution varying according to a Gaussian function or a Normal distribution centred around zero. This has been empirically established and is independent of the other parameters of the DMT signal. For a DMT signal such as this, it is therefore possible to derive a mathematical factor relating the average amplitude of the DMT signal to its peak amplitude. This is due to the fact that the Normal distribution has this property.

Graphs B, C and D of FIG. 1 show a progression in which a DMT signal is contaminated by stronger and stronger AM RFI from one AM radio source. Graph B of FIG. 1 shows the probability distribution function of a DMT signal contaminated by a pure carrier signal of an RFI source. The carrier signal has an amplitude of the same order of magnitude as the amplitude of the DMT signal. The graph shows that the aggregate signal has a probability distribution function that is wider and shorter when compared to the probability distribution function of a received signal presented in Graph A in which the DMT signal dominates the RFI by an order of magnitude.

Graph D of FIG. 1 clearly indicates that the probability distribution function of the RFI contaminated DMT signal no longer exhibits a Gaussian shape. In this case, the contaminating RFI is an order of magnitude stronger than the DMT signal. The shape of the graph B is representative of a sinusoidal carrier AM radio signal. The fact that the shape of the probability distribution function varies with the intensity of the contaminating RFI also shows that the average amplitude of the received signal is no longer related to the peak amplitude by a constant factor.

Table 1 shows the results of actual field measurements performed in residential areas. These measurements demonstrate that the differential received power level of AM interference is a significant deployment issue. The measurements also show that the received power level of AM interference varies considerably from one location to another. The power levels detected by the measurements varied from −15 dB to −100 dB, although the received power levels are usually less than −30 dB.

TABLE 1

| RFI Contamination Lev | | Frequency (kHz) | | | | | | |
|---|---|---|---|---|---|---|---|---|
| Location | Buried/Aerial | 600 | 690 | 730 | 800 | 940 | 990 | 1410 |
| H1 | A | −67.32 | −67.02 | −66.03 | −62.03 | −55.99 | −61.34 | −80.96 |
| H2 | B | −54.92 | −55.43 | −59.82 | −63.81 | −63.25 | −68.37 | −84.56 |
| H4 | A | −82.30 | −81.79 | −83.21 | −83.80 | −87.01 | −86.84 | −88.83 |
| H5 | A | −79.33 | −76.02 | −77.26 | −79.80 | −79.15 | −85.01 | −90.41 |
| H7 | A | −54.15 | −53.33 | −55.67 | −58.15 | −55.80 | −62.94 | −70.90 |
| H8 | B | −93.38 | −92.72 | −93.39 | −93.88 | −91.08 | −87.71 | −59.68 |
| H10 | B | −49.43 | −49.17 | −46.22 | −36.94 | −40.74 | −48.85 | −62.05 |
| H11 | A | −43.83 | −42.95 | −47.91 | −49.31 | −47.03 | −54.22 | −53.80 |
| H12 | A | −45.74 | −49.33 | −52.27 | −53.73 | −52.93 | −59.34 | −67.99 |
| H13 | A | −63.16 | −64.18 | −64.40 | −60.99 | −61.60 | −61.01 | −59.85 |
| H14 | A | −51.38 | −56.77 | −55.56 | −52.81 | −57.76 | −65.77 | −73.97 |
| H15 | A | −63.97 | −48.45 | −44.14 | −46.29 | −33.76 | −27.95 | −50.09 |
| H16 | B | −69.13 | −70.58 | −70.74 | −72.60 | −81.18 | −81.12 | −86.30 |
| H17 | A | −58.05 | −57.69 | −62.21 | −63.95 | −68.89 | −74.48 | −90.61 |
| H18 | A | −52.31 | −49.14 | −51.25 | −52.48 | −45.79 | −52.18 | −55.02 |
| H19 | A | −94.49 | −95.36 | −95.43 | −96.31 | −96.70 | −96.37 | −95.83 |
| H20 | A | −60.17 | −58.95 | −61.50 | −60.10 | −59.11 | −64.97 | −70.25 |

TABLE 1-continued

| RFI Contamination Lev | | Frequency (kHz) | | | | | | |
|---|---|---|---|---|---|---|---|---|
| Location | Buried/Aerial | 600 | 690 | 730 | 800 | 940 | 990 | 1410 |
| H21 | A | −42.45 | −38.07 | −42.63 | −48.40 | −48.34 | −49.75 | −47.94 |
| H22 | A | −73.00 | −67.64 | −64.85 | −55.55 | −45.28 | −50.39 | −75.51 |
| H23 | A | −68.54 | −63.00 | −62.38 | −63.30 | −57.15 | −60.26 | −72.94 |
| H24 | A | −55.21 | −53.84 | −55.25 | −46.76 | −45.93 | −53.09 | −58.80 |
| H25 | A | −67.16 | −58.91 | −61.76 | −56.88 | −49.99 | −55.70 | −81.35 |
| H26 | B | −56.95 | −52.58 | −50.66 | −47.71 | −45.58 | −49.44 | −72.09 |
| H27 | A | −51.59 | −46.94 | −43.67 | −41.28 | −36.31 | −41.12 | −80.99 |
| H28 | B | −57.36 | −53.60 | −56.90 | −56.47 | −52.17 | −55.70 | −73.78 |
| H29 | A | −48.51 | −50.35 | −50.34 | −47.61 | −45.82 | −53.91 | −68.55 |
| H30 | A | −60.94 | −53.02 | −52.33 | −55.61 | −55.83 | −57.81 | −74.98 |
| H31 | A | −24.29 | −16.96 | −18.01 | −26.42 | −35.69 | −41.65 | −49.52 |
| H32 | A | −68.11 | −13.93 | −66.18 | −65.49 | −57.78 | −62.13 | −72.04 |
| H34 | A | −89.09 | −87.90 | −90.69 | −94.54 | −94.34 | −99.66 | −101.98 |

An important signal parameter for a digital subscriber line receiver is total power of all interfering sources after front-end filtering. There are two factors that determine the power of the detected RFI level. They are the strength of the RFI signal and wiring imbalance at the customer end. Both of these factors are important in determining the detected RFI level. Consequently, customer sites with poor wiring may show high levels of interference even if they are far From an AM source, while customer sites with good wiring ay still show high levels of interference if they are lose to an AM source.

Figure 2:
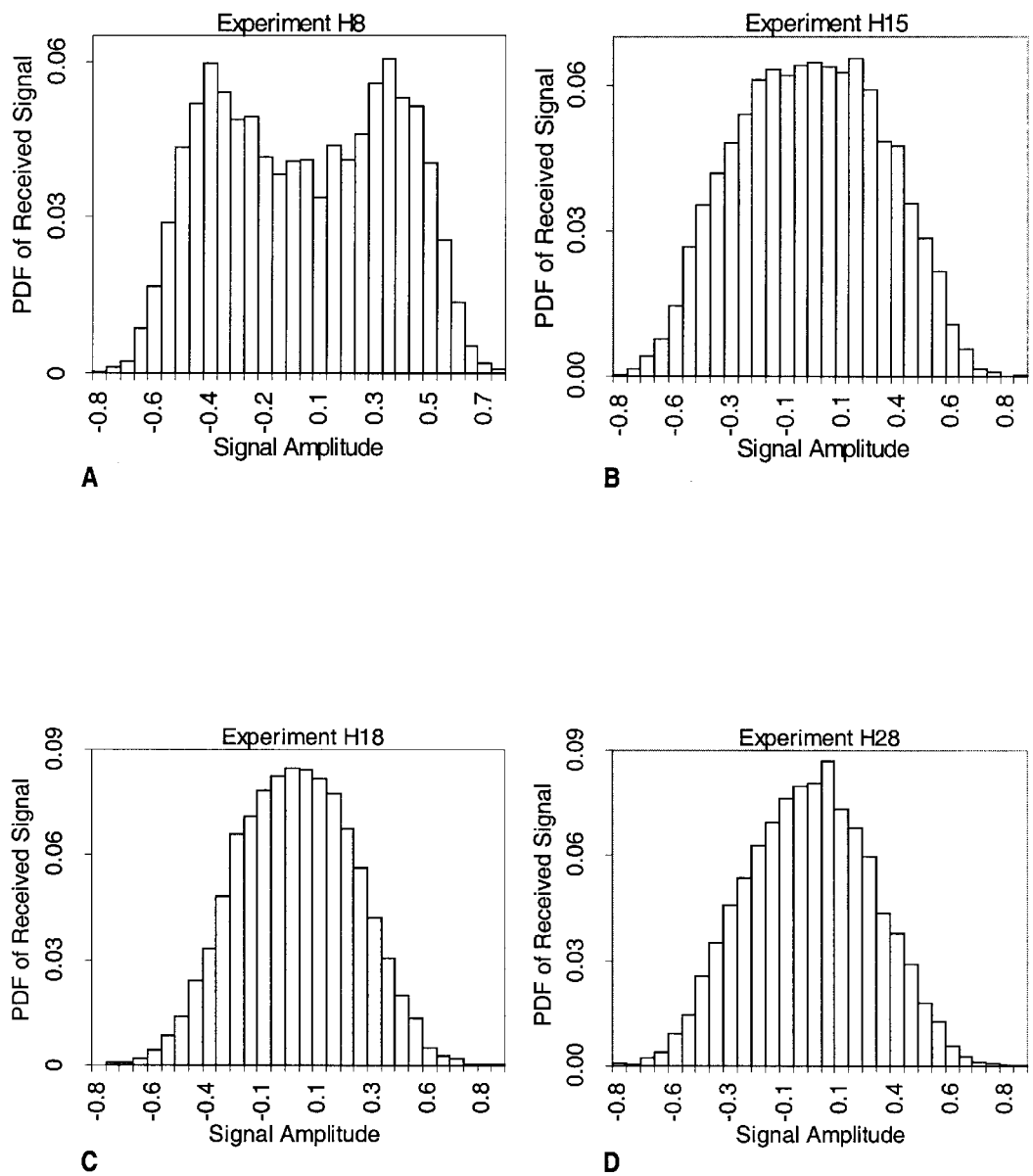
FIG. 2 shows examples of DMT signals contaminated by multiple AM sources of RFI of varying intensities.
Figure 3:
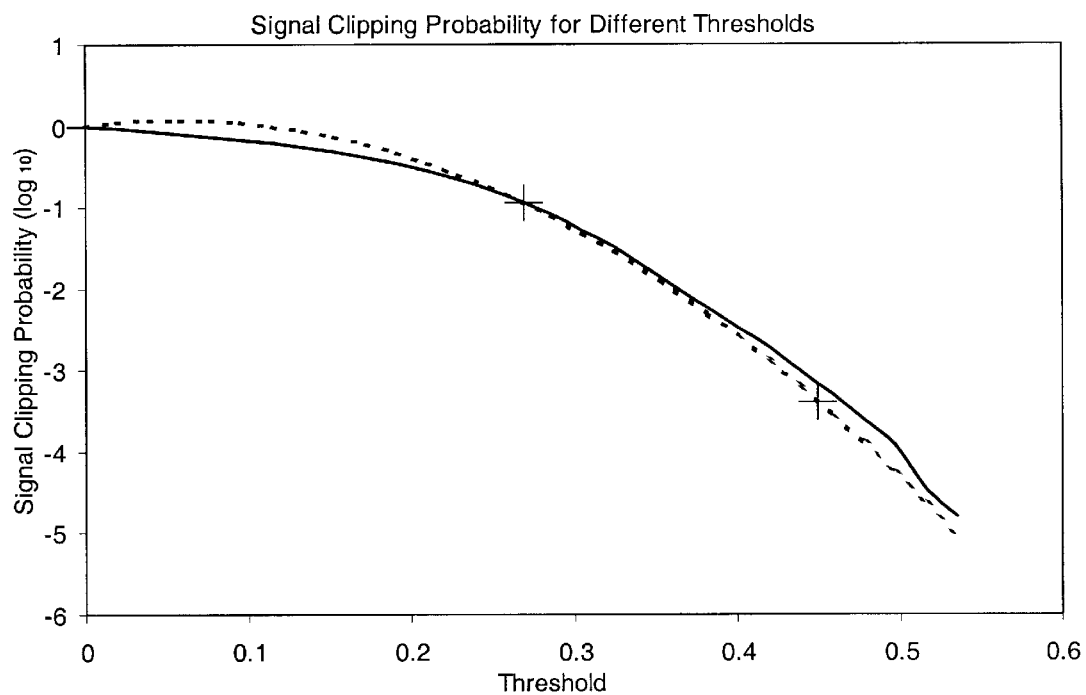
FIG. 3 is a graph illustrating measured signal clipping probabilities of an RFI contaminated DMT signal at different threshold values and a calculated variation of the signal clipping probability for the same RFI contaminated DMT signal generated by measuring signal clipping probabilities at two threshold values and applying a second order curve fitting algorithm.

FIG. 2 shows graphs of the signal amplitude to the probability distribution function of DMT signals contaminated by multiple sources (the seven sources shown in Table 1) of RFI corresponding to the experimental measurements shown at locations H8, H15, H18 and H28 of Table 1. This set of four graphs further illustrates that the probability distribution function is also dependent on the number of radio frequency interference sources as wells as their relative signal strength. Depending on the relative amplitude of the coupled components of the RFI, the signal power to amplitude ratio may change. If one interference source dominates the others, the sum of the signal approximates a sign wave, as seen in Graph A of FIG. 2. If the RFI components are more balanced in amplitude, the resulting signal has a higher peak to average ratio as shown in Graphs C and D of FIG. 2. In general, as the power of the RFI increases, the greater its influence on the DMT signal and when the RFI is more powerful than the DMT signal, the effects of the RFI become quite apparent FIG. 3 is a graph representing the variation of measured signal clipping probabilities of RFI contaminated DMT signals. It has been experimentally observed that the graph of the signal clipping probability tends to be smooth and increases monotonically with increasing threshold levels. This relationship holds for contaminating RFI of low amplitudes relative to that of the DMT signal. The Relationship holds for a DMT signal contaminated by Multiple RFI sources and also holds for modulated AM RFI sources. Measuring the signal clipping probability for a DMT signal as a procedure for deriving the threshold level for a tolerated signal clipping probability is too time consuming to be practical. Therefore, an algorithm has been developed for finding a threshold level at which the signal clipping probability of the DMT signal is within acceptable limits.

Mathematical analysis of empirical data related to a signal clipping probability for a received DMT signal contaminated with RFI shows that a variation of the signal clipping probability with respect to a threshold level can be reasonably represented by a second order function. Therefore, the variation of the signal clipping probability of a RFI contaminated DMT signal can be approximated using a second order function whose parameters are derived from a curve fitting algorithm applied to a small set of signal clipping events measured in real-time with the RFI contaminated DMT signals. The minimum number of real-time measurements of the signal clipping events is dictated by the order of the function employed in curve fitting.

Figure 4:
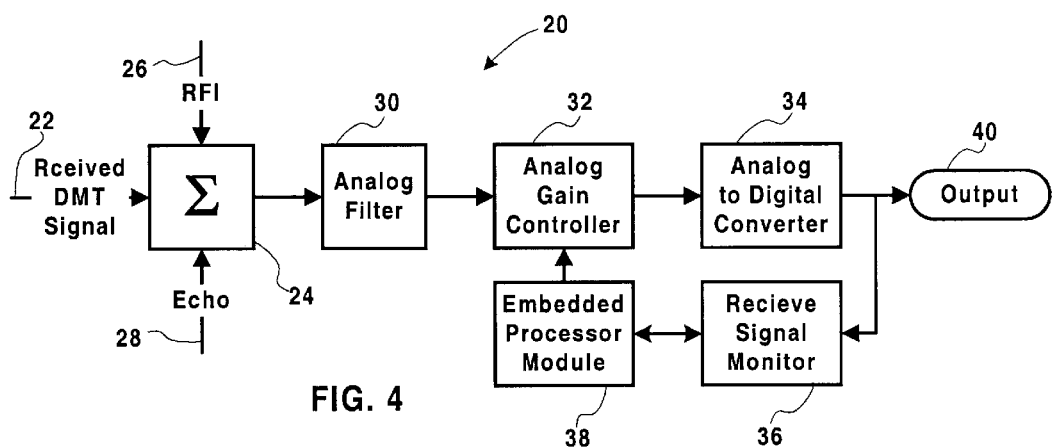
FIG. 4 is a block diagram showing the relationship between a received analog DMT signal, contaminating RFI, analog filtering and the components involved in adjusting the amplitude of the received analog DMT signal to utilize substantially all of a dynamic input range of an analog-to-digital converter.

FIG. 4 shows a receiver front-end 20 of a data transceiver in accordance with a preferred embodiment of the invention. The receiver front-end 20 receives an analog DMT signal 22 and outputs a digital signal 40. The received DMT signal 22 is contaminated by radio frequency interferors 26 and an echo 28 from a transmitted signal of the transceiver. This combined signal 24 is passed through an analog filter 30. The analog filter attenuates the echo signal 28 and it also attenuates signals from higher frequency radio stations. The filtered signal is then passed to an analog gain controller 32 whose function is to amplify the DMT signal before passing it to an analog-to-digital converter 34. A copy of the digital signal output by the analog-to-digital converter 34 is processed by a receive signal monitor 36 which operates under control of an embedded processor module 38. Signal characteristics of the DMT signal are extracted by the receive signal monitor 36, processed by the embedded processor module 38 and based on the results the analog gain controller 32 is adjusted in order to amplify the amplitude of the received DMT signal to utilize substantially all of a dynamic input range of the analog-to-digital converter 34.

Figure 5:
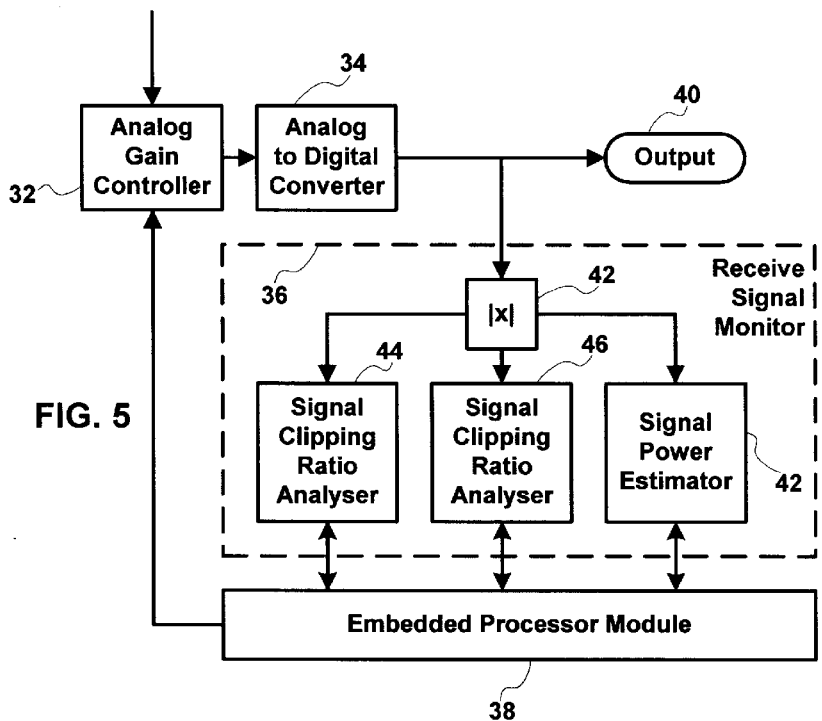
FIG. 5 is a block diagram showing the components of a receive signal monitor in accordance with the invention which includes signal clipping ratio analyzers and a command controllable signal power estimator.

FIG. 5 shows the details of the received signal monitor 36. A copy of the digital signal output by the analog-to-digital converter 34 is rectified by a digital rectifier 42. This operation consists of removing the sign bit of the digital signal. Copies of the rectified digital signal are processed by three components: a command controllable signal power estimator 48 and two command controllable signal clipping ratio analyzers 44 and 46. The signal power estimator 48 and signal clipping ratio analyzers 44 and 46 operate under control of the embedded processor module 38.

Figure 6:
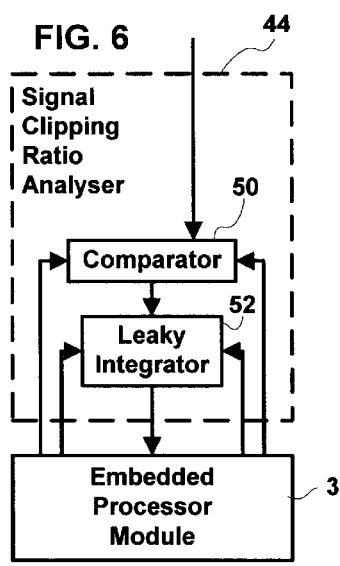
FIG. 6 is a block diagram showing one of the command controllable signal clipping ratio analyzers shown in FIG. 5.

FIG. 6 shows the command controllable signal clipping ratio analyzer 44 in more detail. A copy of the rectified digital signal is first processed by a comparator 50 and then passed to a leaky integrator 52. Both the comparator 50 and the leaky integrator 52 operate under control of the embedded processor module 38. The leaky integrator outputs a computed signal clipping ratio.

Figure 7:
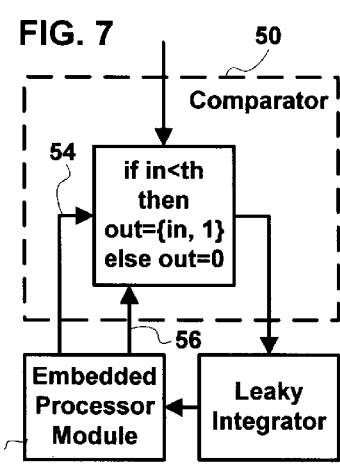
FIG. 7 is a block diagram showing an implementation of the comparator shown in FIG. 6.

FIG. 7 shows the comparator 50 in more detail. Comparator 50 has two modes of operation which can be selected by sending an appropriate signal 56. In both modes of operation, comparator 50 uses a threshold level provided at a threshold level input 54 to perform its function. The signal clipping ratio analyzer 46 receives rectified digital samples from the digital signal rectifier 42 at a rate at which the analog-to-digital converter 34 outputs the samples. Each of the rectified digital samples is compared to the threshold level provided at input 54. According to the mode of operation set by the input signal 56, the comparator 50 outputs either 1 or the value of the rectified digital sample, if the sample is less than the threshold. Otherwise, the comparator 50 outputs a zero. The values output by the comparator 50 are passed to the leaky integrator 52. The operation of the leaky integrator 52 of the signal clipping ratio analyzer 44 is similar to the operation of the leaky integrator 60 of the signal power estimator 48 as described below.

The choice of the mode of operation is dependent on the desired characteristics of the signal clipping ratio analyzer 44. In the first mode, the signal clipping ratio analyzer 44 computes the signal clipping ratio and in the second mode, the signal clipping ratio analyzer 44 computes the average amplitude of the digitized samples which are above the threshold.

Figure 8:
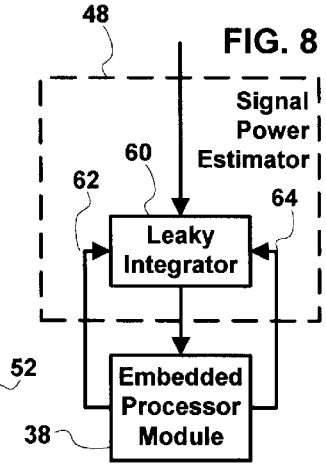
FIG. 8 is a block diagram showing an implementation of the command controllable signal power estimator shown in FIG. 5.

FIG. 8 shows the implementation details of a command controllable signal power estimator 48. The signal power estimator 48 consists of a leaky integrator 60. The leaky integrator 60 operates under the control of an embedded processor module 38. The leaky integrator 60 has two inputs: an input 62 provides the leaky integrator with an initialization value and an input 64 provides the leaky integrator with a convergence time constant. The leaky integrator 60 performs a mathematical function using the incoming rectified digital samples. There is a set of mathematical functions, well known in the art, which when applied to a number of large consecutive sample values, outputs a value that progressively converges to an average of these values.

According to the preferred embodiment of the invention, the leaky integrator 60 uses the following averaging function:

$$LI\_out=(1-\Delta)*previous\_output+\Delta*latest\_received\_sample$$

wherein:
previous-output is LI_out of the immediately preceding sample period; and $$0 \leq \Delta \leq 1$$

The samples are received at the rate of the analog-to-digital converter and the averaging function is applied to the received samples at the same rate. The convergence is dependent on the parameter $\Delta$. Depending on the choice of $\Delta$, the output converges to the average of the received samples in a short period of time or a long period of time. When $\Delta$ is closer to zero, the averaging process implemented through the above-averaging function is said to have a "long memory", converges slowly to the average of the received samples and is very resilient to variations in the value of the received samples. Conversely, when $\Delta$ is close to one, the averaging process has a "short memory", converges quickly to the average of the received samples and is more sensitive to variations in the value of the received samples. Fast convergence as well as resilience to variations in the value of the received samples are required. A compromise is therefore made in choosing the value of $\Delta$ to optimize both convergence time and resilience to variations in the value of the received samples. The value of $\Delta$ is empirically derived. The output of the averaging function will invariably converge to the average of the received samples. This will happen regardless of an initial value of the output, but an educated guess at what the initial value of the output should speed up the convergence process.

According to the invention, a transceiver 20 disables data transmissions on start-up and, together with the transmitter at the other end, enters a signal gain adaptation process. The transmitter at the other end generates a DMT signal 22. The receiver front-end of the transceiver 20 receives the DMT signal 22, radio frequency interference 26, as well as an echo signal 28 from the transmitter side of the transceiver. The combined signal 24 is passed through an analog filter 30. The analog filter 30 attenuates the echo signal 28 in accordance with methods known in the art, and also filters out the high radio frequency interferors in the AM band. The filtered signal is passed on to the analog gain controller 32 which applies an initial amplification factor to the analog DMT signal and then passes the amplified signal to the analog-to-digital converter 34. The analog-to-digital converter 34 outputs a digital copy of the received DMT signal. For the gain adaptation process, a copy of the digitized DMT signal is passed to a command controllable received signal monitor 36.

In a first step of the adaptation, a rectified copy of the digitized signal output by a digital signal rectifier 42, is passed to a command controllable signal power estimator 48. Under the control of an embedded processor module 38, the command controllable signal power estimator 48 is provided with an initial value 62 and a convergence time constant 64. The function of the command controllable signal power estimator 48 is implemented using a leaky integrator 60. The output of the leaky integrator 60 represents the average signal power of the received DMT signal subject to the amplification performed by the analog gain controller 32. The embedded processor module 38 analyzes the output of the leaky integrator 60 and, when appropriate, sends a command to the analog gain controller 32 to apply an amplification factor to the received DMT signal. The amplification is based on the output of the leaky integrator weighted by an assumption of a worst case peak to average ratio of the signal. Empirical evidence indicates that an amplification factor of at least about 5 times the measured average power of the received signal is appropriate.

With the analog gain control adjusted for the worst case, the received analog DMT signal is amplified and passed to the analog-to-digital converter 34. A copy of the digitized signal is passed through the digital signal rectifier 42 to provide a rectified digitized signal for two command controllable signal clipping ratio analyzers 44, 46 and the signal power estimator 48. The signal power estimator 48 again outputs an average signal power value that is used to initialize the two signal clipping ratio analyzers 44 and 46. The threshold of one of the signal clipping ratio analyzers is set to an initial value of about 1.5 to 2 times the average signal power output by the signal power estimator 48. The threshold of the other signal clipping ratio analyzer is set to an initial value of about 2.2 to 2.8 times the average signal power provided by the signal power estimator 48. The leaky integrators of the command controllable signal clipping ratio analyzers 44 and 46 are also provided with initial values and empirically derived convergence time constants in a range of $2^{-8}$ to $2^{-20}$. After a period in which enough data samples are passed through the signal clipping ratio analyzers 44 and 46, the output values of the leaky integrators converge to signal clipping ratios corresponding to the threshold values set.

The embedded processor module 38 uses the two signal clipping ratio analyzers plus a theoretical clipping ratio corresponding to a threshold level of zero, which results in a signal clipping ratio of 1.0, as variables in a curve fitting algorithm employing a second order function. The curve fitting algorithm enables the embedded processor module 38 to extrapolate a threshold value corresponding to a target signal clipping ratio, e.g., $10^{-7}$. Using an inverse of the extrapolated threshold value and knowledge about the current amplification factor of the analog gain controller 32, a new amplification factor is calculated by the embedded processor module 38. This new amplification factor is sent to the analog gain controller 32, to permit the analog gain controller 32 to adjust the amplitude of the received analog DMT signal 22 contaminated by the RFI 26, in order to utilize substantially all of a dynamic input range of the analog-to-digital converter 34, thereby minimizing quantization noise.

TABLE 2

| Case RFI to DMT Power Ratio (dB) | One RFI Source | | | Three RFI Sources | | |
|---|---|---|---|---|---|---|
| | Increased AGC gain | RFI PAR | Threshold values | Increased AGC gain | RFI PAR | Threshold values |
| 0 | 1.1 | 2.64 | 1.8,2.5 | 0.6 | 3.7 | 1.8,3 |
| 10 | 3.8 | 2.65 | 1.8,2.5 | 1.3 | 3.45 | 1.8,3 |
| 20 | 4.5 | 2.3 | 1.4,2 | 1.8 | 3.34 | 1.8,3 |
| 30 | 5 | 2.57 | 1.4,2 | 2.1 | 3.38 | 1.8,3 |

Table 2 shows a summary of analog gain control increase achieved using the apparatus and method in accordance with the invention. An improvement of up to a 5 dB increase in analog gain control was achieved.

The results shown in Table 2 were obtained during simulations of a) a single RFI source at 555 KHz and b) three RFI sources at 555 KHz, 585 KHz and 625 KHz. Each source was modulated with a random speech signal to emulate real RFI. The DMT signal was adjusted to emulate a loop length of 11kft with an echo path signal. The power level of the DMT was measured at the input of the ADC 34 (FIG. 4) and the RFI was normalized relative to the DMT signal to simulate different RFI power scenarios. As seen in Table 2, simulations were performed for RFI power to DMT power at ratios of 0, 10, 20 and 30 dB.

As is apparent, the greatest increase in analog gain control was achieved when the DMT was contaminated by a single powerful RFI source, i.e., the analog input to the AGC 32 was least Gaussian. The results shown in Table 2 are indicative only of trends in performance since the actual increases achieved in automatic gain control are dependent on a plurality of factors discussed above.

Although the invention has been described with explicit reference to DMT transceivers, a person skilled in the art will understand that the invention may be applied to other forms of broadband transmission which are susceptible to contamination from narrowband radio frequency interference.

It should also be understood that the invention may be practised using curve fitting algorithms of higher orders, which would require a correspondingly larger number of real-time measured signal clipping ratios. Measurement of signal clipping ratios can be implemented using a small number of command controllable signal clipping analyzers by periodically changing the threshold levels.

We claim:

1. Apparatus for analog gain control in a transceiver at an end of a data link carring an analog signal contaminated by radio frequency interference (RFI). the transceiver having a receiver component with an analog gain controller which amplifies the analog signal and outputs the amplified signal to an analog-to-digital converter (ADC), comprising:

a receive signal monitor including a signal rectifier, at least one command controllable signal clipping probability analyzer, and a leaky integrator having an input for accepting a convergence time constant and an input for accepting an initialization value the receive signal monitor extracting at least an average signal power estimation and a clipping probability ratio of a digital signal output by the ADC; and an embedded processor module for calculating an amplification factor applied by the analog gain controller using the characteristics of the digital signal in a probabilistic algorithm, in order to adjust an amplitude of the analog signal to utilize a greater input dynamic range of the ADC, thereby reducing quantization noise of the output digital signal.

2. Apparatus as claimed in claim 1, wherein each command controllable signal clipping probability analyzer comprises:

a comparator having an input for accepting a threshold value; and a leaky integrator having an input for accepting a convergence time constant and an input for accepting an initialization value.

3. Apparatus as claimed in claim 2, wherein the comparator has at least two modes of operation, comprising:

a first mode in which the comparator outputs the rectified digital signal to the leaky integrator when a value of the rectified digital signal is less than a predetermined threshold; and a second mode in which the comparator outputs a digital one when the digital signal does not exceed the threshold.

4. Apparatus for analog gain control in a transceiver at an end of a data link carrying an analog signal distorted by radio frequency interference (RFI), the transceiver having a receiver component with an analog gain controller which outputs an amplified received signal to an analog-to-digital converter (ADC), comprising:

a receive signal monitor including a circuit for measuring an average power of a digital signal output by the ADC, and one signal clipping probability analyzer that is periodically reprogrammed with a new threshold level in order to compute different signal clipping ratios for the digital signal output by the ADC; and an embedded processor module for calculating an amplification factor applied by the analog gain controller using the average power and the signal clipping probability of the digital signal using a mathematical algorithm in order to determine an adjustment for an amplitude of the analog signal to utilize a greater input range of the ADC, thereby reducing quantization noise of the output digital signal.

5. Apparatus for analog gain control in a transceiver at an end of a data link carrying an analog signal distorted by radio frequency interference (RFI), the transceiver having a receiver component with an analog gain controller which outputs an amplified received signal to an analog-to-digital converter (ADC), comprising:

a receive signal monitor including a circuit for measuring an average power of a digital signal output by the ADC, and a comparator and a leaky integrator, the comparator having at least two modes of operation, a first mode in which the comparator passes an output of the ADC to the leaky integrator if the signal output by the ADC is less than a threshold value stored by the comparator; and a second mode in which the comparator passes a digital one to the leaky integrator if the signal output by the ADC is less than a threshold value stored by the comparator; and an embedded processor module for calculating an amplification factor applied by the analog gain controller using the average power and the signal clipping probability of the digital signal using a mathematical algorithm in order to determine an adjustment for an amplitude of the analog signal to utilize a greater input range of the ADC, thereby reducing quantization noise of the output digital signal.

6. Apparatus as claimed in claim 5 wherein the receive signal monitor comprises at least two signal clipping probability analyzers and each one of the signal clipping probability analyzers is provided with a different threshold level for computing a signal clipping ratio for the digital signal output by the ADC.

7. Apparatus as claimed in claim 5 wherein the circuit for measuring an average power of the digital signal output by the ADC comprises a leaky integrator.

8. A method of adjusting an amplitude of an analog received signal by an analog gain controller of a transceiver, comprising the steps of:

determining a predetermined number of characteristic respecting an amplitude distribution of the analog signal by analyzing an output of an analog-to-digital converter (ADC) in a receiver circuit of the transceiver;

using the characteristics in a mathematical algorithm to determine a gain adjustment to be applied to the analog signal;

controlling the analog gain controller to adjust the amplitude of the analog signal based on the gain adjustment in order to utilize a greater input range of an analog-to-digital converter, thereby minimizing quantization noise in the digital signal output by the analog-to-digital converter;

accumulating digital samples in a leaky integrator at the sampling rate of an analog-to-digital converter for converting the analog signal to a digitized signal, the digital samples being accumulated for a time period corresponding to a first convergence time constant;

outputting a value from the leaky integrator representative of the average power of the analog signal;

rectifying the digital samples;

calculating signal clipping ratios for at least two threshold levels;

outputting the signal clipping ratios to an embedded processor;

initializing at least one command controllable signal clipping probability analyzer with respective threshold levels, convergence time constants and initial values;

accumulating the digital samples at the sampling rate of the analog-to-digital converter for time periods corresponding to the respective convergence time constants;

deriving a first and second signal clipping ratios; and making the first and second signal clipping ratios available to the embedded processor.

9. A method as claimed in claim 8 wherein on power-up or on loss of carrier, the transceiver enters a set-up phase which comprises a step of activating a set-up mode of operation of the transceiver and the method further comprises the steps of:

calculating an average power of the analog signal using a command controllable signal power estimator;

sending a command to the analog gain controller to adjust the amplitude of the analog signal based on the average power and a worst case peak to average ratio of the received signal.

10. A method as claimed in claim 9, in which the step of sending a command to the analog gain controller to adjust the amplitude of the analog signal based on a worst case peak to average ratio of the received signal further comprises the steps of:

deriving a first amplification factor by applying a first empirically determined mathematical factor to an output value of the signal power estimator; and adjusting a gain control of the analog gain controller using the first amplification factor.

11. A method as claimed in claim 10, in which the first mathematical factor is at least 5.

12. A method as claimed in claim 8, in which the step of initializing at least one command controllable signal clipping analyzer comprises selecting first and second threshold levels based on empirical evidence, such that the outputs of the at least one signal clipping analyzer quickly converges to the first and second signal clipping ratios.

13. A method as claimed in claim 12, in which the first and second threshold levels are selected to be within 1.5 and 2 times the average power level of the analog signal for the first threshold level, and within 2.2 and 2.8 times the average power level of the analog signal for the second threshold level.

14. A method as claimed in claim 12, in which the step of calculating signal clipping ratios for at least two threshold levels is performed by two command controllable signal clipping probability analyzers.

15. A method as claimed in claim 8, in which the step of using the characteristics in a mathematical algorithm, further comprises the steps of:

using two signal clipping probability ratios output by the receive signal monitor using two known threshold levels, and a theoretical clipping ratio of one corresponding to a threshold level of zero;

applying a curve fitting algorithm to the three signal clipping ratios and threshold levels to derive a function characterizing the analog signal; and extrapolating a target threshold level corresponding to a target signal clipping probability ratio based on the derived function.

16. A method as claimed in claim 15, in which the step of applying a curve fitting algorithm to derive a function describing the analog signal employs at least a second order curve fitting algorithm.

17. A method as claimed in claim 9 wherein after initialization of the transceiver, a monitoring mode is entered, the monitoring mode comprising the step of:

selecting the first and second threshold levels to ensure that the signal clipping ratio remains below a target signal clipping ratio of $10^{-7}$ while improving the accuracy of the probabilistic algorithm by continuously monitoring the output of the ADC and programming the clipping signal analyzers with new thresholds to assess the automatic gain control.

18. Apparatus for analog gain control in a transceiver having a receiver component with an analog gain controller and an analog-to-digital converter, comprising:

a receive signal monitor that includes a signal rectifier, at least two command controllable signal clipping probability analyzers respectively including a comparator having an input for accepting a threshold value;

a leaky integrator having an input for accepting a convergence time constant, an initialization value and an output of the comparator;

a command controllable signal power estimator for determining at least the characteristics of an average signal power and a signal clipping probability ratio of the digital signal; and an embedded processor module for calculating, according to a probabilistic algorithm using the characteristics, an amplification factor applied by the analog gain controller to a received analog signal contaminated by radio frequency interference in order to adjust an amplitude of the analog signal to utilize a greater input range of the analog-to-digital converter, thereby reducing quantization noise of the output digital signal.

19. A transceiver as claimed in claim 18, wherein the comparator may be operated in either one of first and second modes, the first mode comprising outputting to the leaky integrator a rectified value of the digital signal output by the analog-to-digital converter when the rectified output is less than the threshold value, and the second mode comprising outputting to the leaky integrator a digital value of one when a rectified value of the digital signal output by the analog-to-digital converter is less than the threshold value.

20. A transceiver as claimed in claim 18, wherein the command controllable signal power estimator comprises a leaky integrator having an input for receiving a convergence time constant and an input for receiving an initialization value.

\* \* \* \* \*